(12) United States Patent
Hill (10) Patent No.: US 7,469,453 B2
(45) Date of Patent: Dec. 30, 2008

(54) DEPANELING SYSTEM HAVING FIXTURE PALLETS THAT TILT TOWARD AN OPERATOR

(75) Inventor: Kurt John Hill, Berthoud, CO (US)

(73) Assignee: Cencorp USA, Inc., McAllen, TX (US)

( * ) Notice: Subject to any disclaimer, the term of this patent is extended or adjusted under 35 U.S.C. 154(b) by 302 days.

(21) Appl. No.: 11/273,969

(22) Filed: Nov. 15, 2005

(65) Prior Publication Data
US 2007/0067974 A1   Mar. 29, 2007

Related U.S. Application Data

(60) Provisional application No. 60/720,766, filed on Sep. 26, 2005.

(51) Int. Cl.
*B23C 9/00* (2006.01)
(52) U.S. Cl. .......................... 29/33 P; 409/164; 269/58
(58) Field of Classification Search ............... 29/33 P, 29/825, 829, 831, 846, 849; 83/56, 451, 83/467.1, 468.6, 100, 614, 929.1, 939, 953; 269/38, 45, 54, 54.4, 54.5, 54.1, 58, 295, 269/900, 903; 409/163, 164, 166, 171
See application file for complete search history.

(56) References Cited

U.S. PATENT DOCUMENTS

| | | | | | |
|---|---|---|---|---|---|
| 4,667,868 | A | * | 5/1987 | Decker et al. | 269/903 |
| 4,829,651 | A | * | 5/1989 | Shirai | 29/798 |
| 4,871,106 | A | * | 10/1989 | Wharff | 269/903 |
| 4,964,560 | A | * | 10/1990 | Wharff | 269/903 |
| 5,094,160 | A | * | 3/1992 | Jennings | 101/127.1 |
| 5,438,740 | A | * | 8/1995 | Carr et al. | 29/33 P |
| 5,503,068 | A | * | 4/1996 | Newman | 101/126 |
| 5,575,206 | A | * | 11/1996 | Szyszko | 101/126 |
| 5,694,845 | A | * | 12/1997 | Newman | 101/126 |
| 5,783,370 | A | * | 7/1998 | Groom et al. | 269/903 |
| 5,832,822 | A | * | 11/1998 | Hamu | 101/126 |
| 5,894,648 | A | * | 4/1999 | Hill et al. | 29/33 P |
| 5,974,962 | A | * | 11/1999 | Hamu et al. | 101/126 |
| 6,192,563 | B1 | * | 2/2001 | Carr et al. | 29/33 P |
| 6,240,841 | B1 | * | 6/2001 | Newman et al. | 101/126 |
| 6,718,858 | B2 | * | 4/2004 | Tripard | 83/467.1 |
| 2003/0164077 | A1 | * | 9/2003 | Hill et al. | 83/100 |

* cited by examiner

*Primary Examiner*—Dana Ross
(74) *Attorney, Agent, or Firm*—Duft Bornsen & Fishman LLP (57) ABSTRACT

Depaneling systems are disclosed for liberating circuit boards from panels. A depaneling system of the invention includes a cutting apparatus adapted to cut circuit boards from a panel, and a fixture pallet adapted to support a panel of circuit boards for cutting by the cutting apparatus. The fixture pallet is also adapted to tilt toward an operator to allow the operator to register a panel on the fixture pallet.

19 Claims, 9 Drawing Sheets

DEPANELING SYSTEM HAVING FIXTURE PALLETS THAT TILT TOWARD AN OPERATOR

RELATED APPLICATIONS

This non-provisional application claims priority to U.S. provisional application 60/720,766, filed on Sep. 26, 2005, which is incorporated herein by reference.

BACKGROUND OF THE INVENTION

1. Field of the Invention

The invention is related to the field of depaneling systems, and in particular, to a depaneling system having one or more fixture pallets adapted to tilt toward an operator of the depaneling system to allow for loading and/or unloading of panels.

2. Statement of the Problem

Printed Circuit Boards (PCB) are used in many common electronic devices, such as computers and televisions. The demand for electronic devices has driven the need to mass produce the PCBs used in the electronic devices. One way to mass produce PCBs is to fabricate multiple PCBs on a panel. After being fabricated, the individual PCBs are liberated from the panel by cutting the PCBs out of the panel. The PCBs may be pre-routed so that only the remaining tabs connecting the PCBs to the panel need to be cut.

There are a variety of automated depaneling systems used to cut PCBs out of a panel. Some examples of depaneling systems are illustrated in U.S. Pat. No. 6,357,108, U.S. Pat. No. 5,894,648, U.S. Pat. No. 5,438,740, U.S. Pat. No. 5,117,554, U.S. Pat. No. 4,683,789, and U.S. Pat. No. 4,742,615, which are all hereby incorporated by reference to the same extent as if fully set forth herein. A typical depaneling system has a horizontal fixture pallet and a cutting apparatus, such as a router or saw. One or both of the horizontal fixture pallet and cutting apparatus are movable with respect to one another in order to cut different PCB patterns out of the panel. To mount a panel to be cut on the horizontal fixture pallet, the horizontal fixture pallet is moved to a load/unload station of the depaneling system. An operator then registers the panel in a tooling fixture and attaches the tooling fixture to the horizontal fixture pallet. Alternatively, the operator registers the panel directly to the horizontal fixture pallet. The horizontal fixture pallet is moved from the load/unload station to a cutting station proximate to the cutting apparatus, and the cutting apparatus cuts the PCBs from the panel. The horizontal fixture pallet is then moved from the cutting station back to the load/unload station. The operator removes the PCBs and scraps of panel from the horizontal fixture pallet and registers a new panel for cutting.

One problem with the present horizontal fixture pallets is that they are fixed horizontally. An operator may have to bend over to load a tooling fixture onto the horizontal fixture pallet. Loading a tooling fixture in this manner onto a horizontal fixture pallet may not be ergonomically correct or ergonomically preferred.

SUMMARY OF THE SOLUTION

The invention helps solve the above problems with a depaneling system having one or more fixture pallets adapted to tilt toward an operator to allow for loading or unloading of panels. The fixture pallets may be tilted when in a load/unload station so that the operator can more easily attach a tooling fixture or panel to the fixture pallet. The angle of a fixture pallet during loading is more ergonomically correct than prior depaneling systems.

In an exemplary embodiment of the invention, a depaneling system includes a cutting apparatus adapted to cut circuit boards from a panel, and a fixture pallet adapted to support a panel of circuit boards for cutting by the cutting apparatus. The fixture pallet is also adapted to tilt toward an operator to allow the operator to register a panel on the fixture pallet.

According to features and aspects of the invention, the fixture pallet is adapted to pivot on a pivot axis to tilt a registration surface of the fixture pallet toward the operator to allow the operator to register the panel on the registration surface of the fixture pallet.

According to features and aspects of the invention, the depaneling system further comprises a cutting station that includes the cutting apparatus, a load/unload station where panels are loaded into or unloaded from the depaneling system, and a control system adapted to control the movement of the fixture pallet between the cutting station and the load/unload station. The control system is adapted to move the registration surface of the fixture pallet from a horizontal position to a tilted position to tilt the registration surface of the fixture pallet toward the operator when the fixture pallet is in the load/unload station. The control system may move the registration surface of the fixture pallet from the tilted position to the horizontal position before the fixture pallet is moved out of the load/unload station.

According to features and aspects of the invention, the fixture pallet includes a registration member having a registration surface adapted to register a panel for cutting, a base, and a pivot mechanism connecting the registration member to the base that defines a pivot axis. The fixture pallet may further include an actuator mechanism connected to at least the registration member that is adapted to move the registration member so as to tilt the registration surface of the registration member about the pivot axis towards the operator.

According to features and aspects of the invention, the depaneling system may further comprise another fixture pallet adapted to support a panel of circuit boards for cutting by the cutting apparatus. The two fixture pallets are positioned with one fixture pallet above the other fixture pallet along a vertical axis providing an over-under configuration of the fixture pallets. Both fixture pallets of the depaneling system may be adapted to tilt toward the operator.

The invention may include other exemplary embodiments described below.

DESCRIPTION OF THE DRAWINGS

The same reference number represents the same element on all drawings.

DETAILED DESCRIPTION OF THE INVENTION

FIGS. 1-9 and the following description depict specific embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
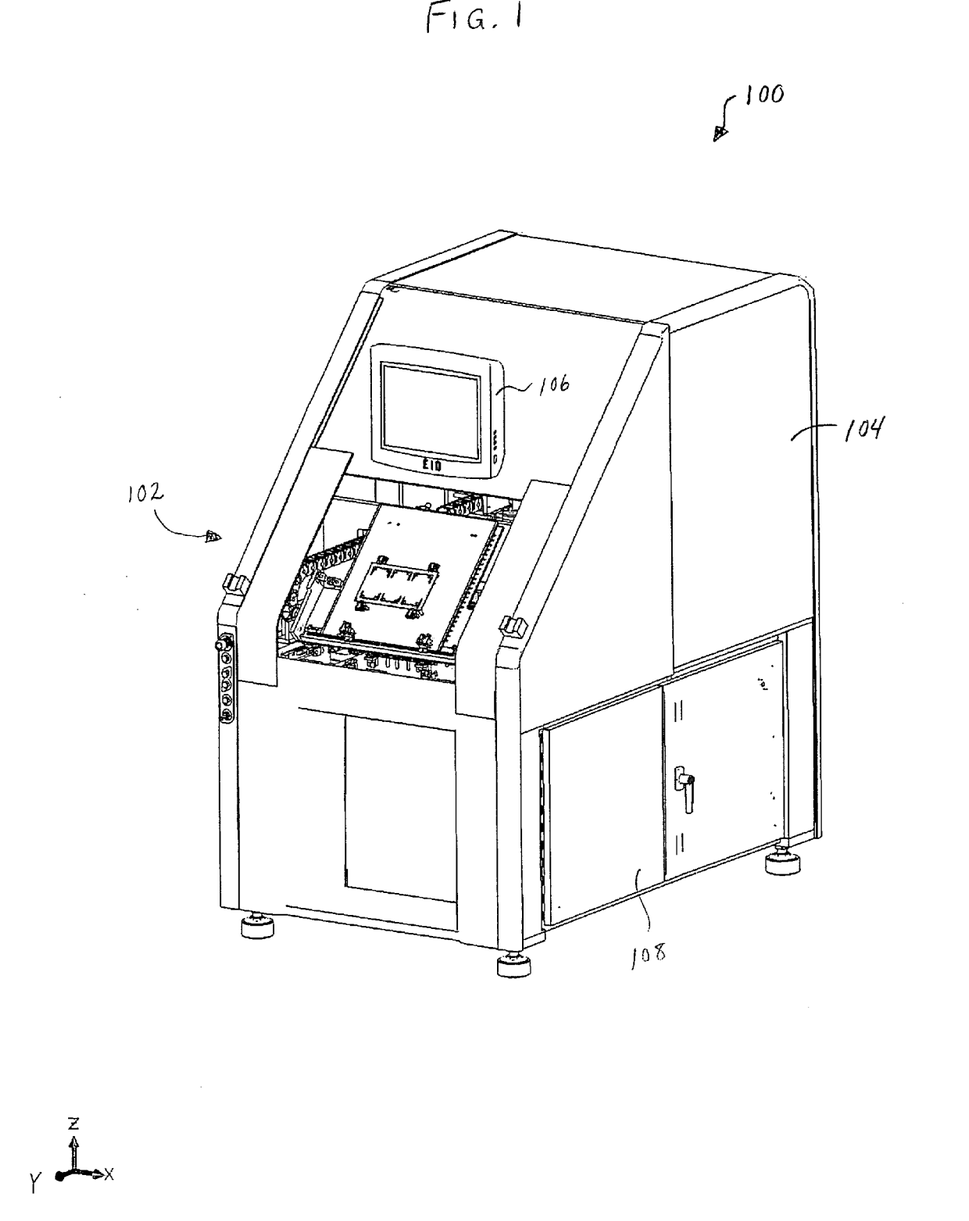
FIG. 1 is an isometric view of a depaneling system in an exemplary embodiment of the invention.

FIG. 1 is an isometric view of a depaneling system 100 in an exemplary embodiment of the invention. Depaneling system 100 comprises any system or device configured to cut or otherwise liberate circuit boards (referred to herein as Printed Circuit Boards (PCBs)) from panels. The panels include an array of PCBs to be cut from the panels. The PCBs may or may not be populated with components, such as processors, resisters, capacitors, etc.

Depaneling system 100 includes a load/unload station 102 for loading and/or unloading panels. A load/unload station comprises the location of depaneling system 100 where panels are loaded onto a fixture pallet or unloaded from a fixture pallet by an operator or automated system. "Loading" a panel refers to registering a panel on a tooling fixture that is registered on a fixture pallet, or registering a panel directly on the fixture pallet. "Unloading" a panel refers to removing the liberated PCBs and scraps of the panel from the tooling fixture or the fixture pallet. The terms "load" and "register" may be used interchangeably herein.

Depaneling system 100 also includes a control system 106 that controls the operation of depaneling system 100. Control system 106 may be comprised of instructions that are stored on storage media. The instructions can be retrieved and executed by a processor. Some examples of instructions are software, program code, and firmware. Some examples of storage media are memory devices, tape, disks, integrated circuits, and servers. The instructions are operational when executed by the processor to direct the processor to operate in accordance with the invention. The term "processor" refers to a single processing device or a group of inter-operational processing devices. Some examples of processors are computers, integrated circuits, and logic circuitry. Those skilled in the art are familiar with instructions, processors, and storage media. The storage media and processor(s) of control system 106 may be stored behind access doors 108.

Other internal components of depaneling system 100 are covered by canopy 104 in FIG. 1.

Figure 2:
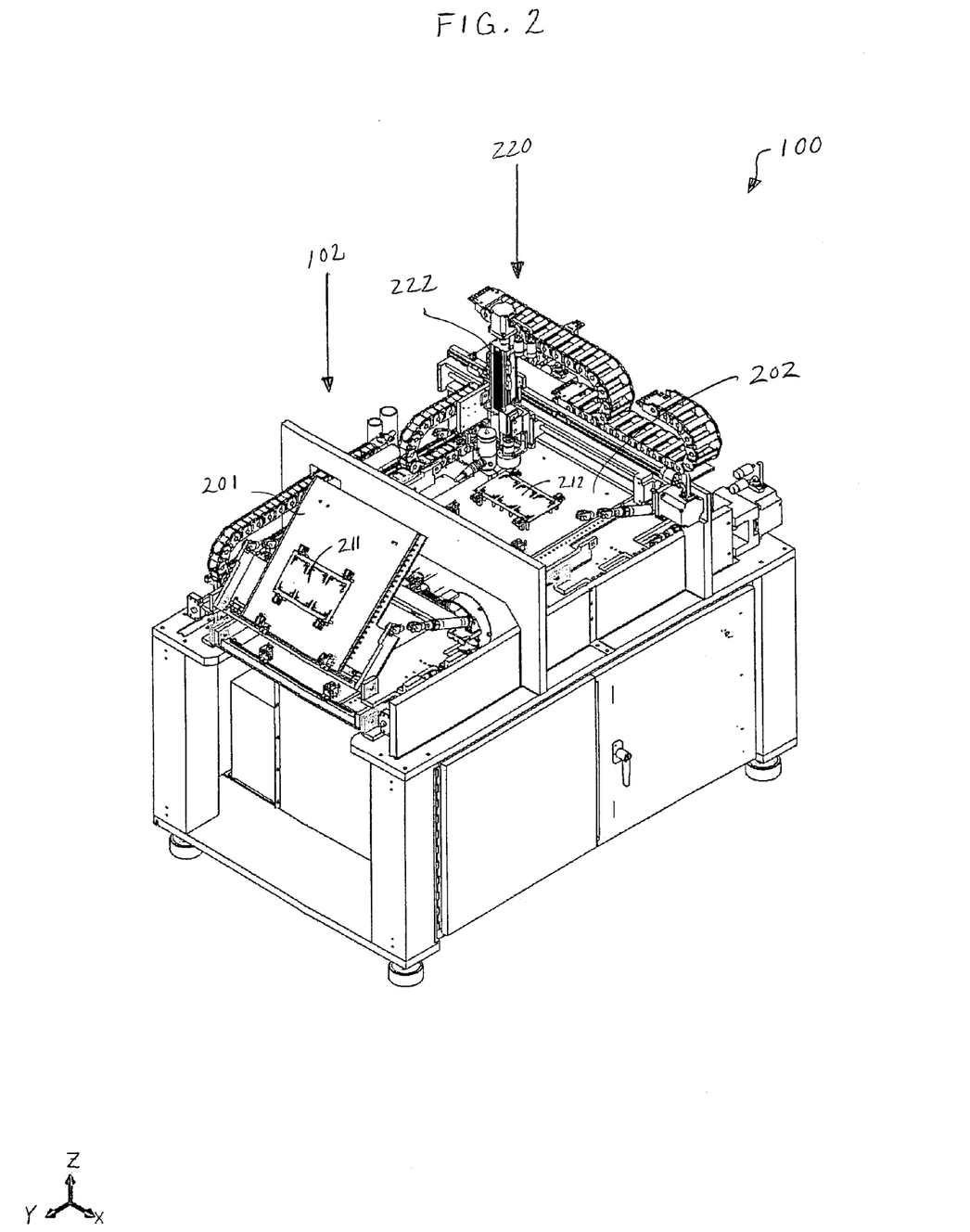
FIG. 2 is an isometric view of the depaneling system with the canopy removed in an exemplary embodiment of the invention.

FIG. 2 is an isometric view of depaneling system 100 with the canopy 104 removed in an exemplary embodiment of the invention. Depaneling system 100 includes two fixture pallets 201-202. A fixture pallet comprises any support structure for supporting, holding, or otherwise securing a panel for cutting. A fixture pallet may include one or more clamps, one or more registration pins, or any other securing mechanism for securing a panel. Although two fixture pallets 201-202 are shown in FIG. 2, depaneling system 100 may include other fixture pallets not shown. Alternatively, depaneling system 100 may include a single fixture pallet depending on the desired throughput of the system.

Fixture pallet 201 is illustrated as supporting a registered panel 211. Fixture pallet 202 is illustrated as supporting a registered panel 212. Those skilled in the art understand that fixture pallets 201-202 may secure more than one panel in other embodiments.

Depaneling system 100 includes load/unload station 102 and a cutting station 220. A cutting station comprises the location of depaneling system 100 where panels are cut by a cutting apparatus 222, such as a router, saw, laser, etc.

Figure 3:
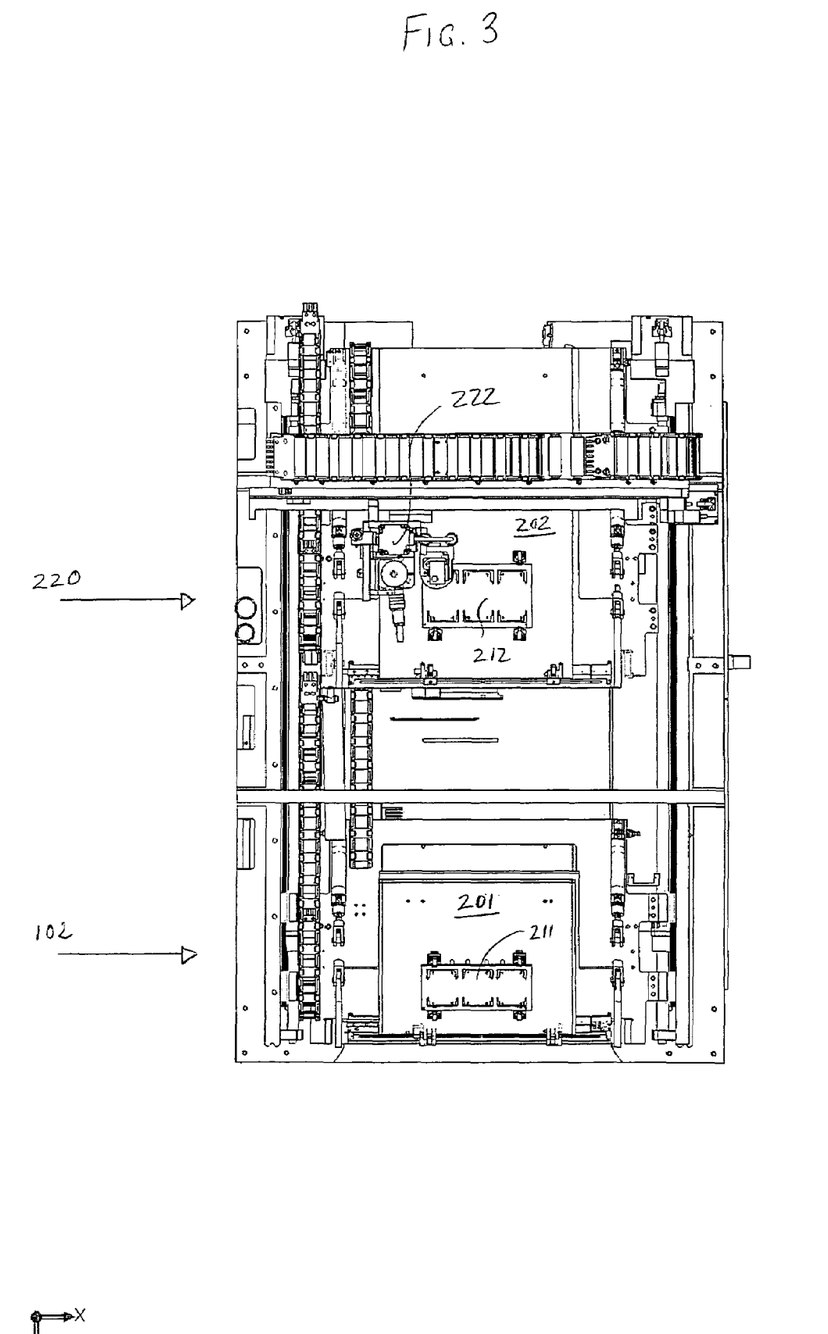
FIG. 3 is a top view of the depaneling system in an exemplary embodiment of the invention.

FIG. 3 is a top view of depaneling system 100 in an exemplary embodiment of the invention. FIG. 3 further illustrates the load/unload station 102 and the cutting station 220. Each fixture pallet 201-202 is adapted to move between the load/unload station 102 and the cutting station 220 along the Y-axis (which is up and down in FIG. 3), such as under the control of control system 106.

According to features and aspects herein, fixture pallet 201 is adapted to tilt toward the operator (not shown) of depaneling system 100 to allow the operator to register a panel on fixture pallet 201. An operator of depaneling system 100 would typically stand in front of the load/unload station 102 to load panels onto fixture pallets 201-202. When in the load/unload station 102, fixture pallet 201 tilts toward the operator to allow the operator to register panel 211 on the fixture pallet 201. The position of the fixture pallet 201 as tilted toward the operator more easily and comfortably allows the operator to register panel 211 on fixture pallet 201. Those skilled in the art understand that automated systems may feed panels to a depaneling system, which is also within the scope of the invention.

Fixture pallet 202 may likewise be adapted to tilt toward the operator. Fixture pallet 202 is illustrated as being positioned in the cutting station 220 in FIG. 2. If fixture pallet 202 were moved to the load/unload station 102, then fixture pallet 202 may be able to tilt toward the operator as is illustrated for fixture pallet 201.

When a panel 211 is loaded onto fixture pallet 201 and fixture pallet 201 is ready to move to cutting station 220, fixture pallet 201 may then be moved from the tilted position to a horizontal position. Fixture pallet 201 may then be moved to cutting station 220 (which is occupied by fixture pallet 202 in FIG. 3) to provide for cutting of panel 211.

Figure 4:
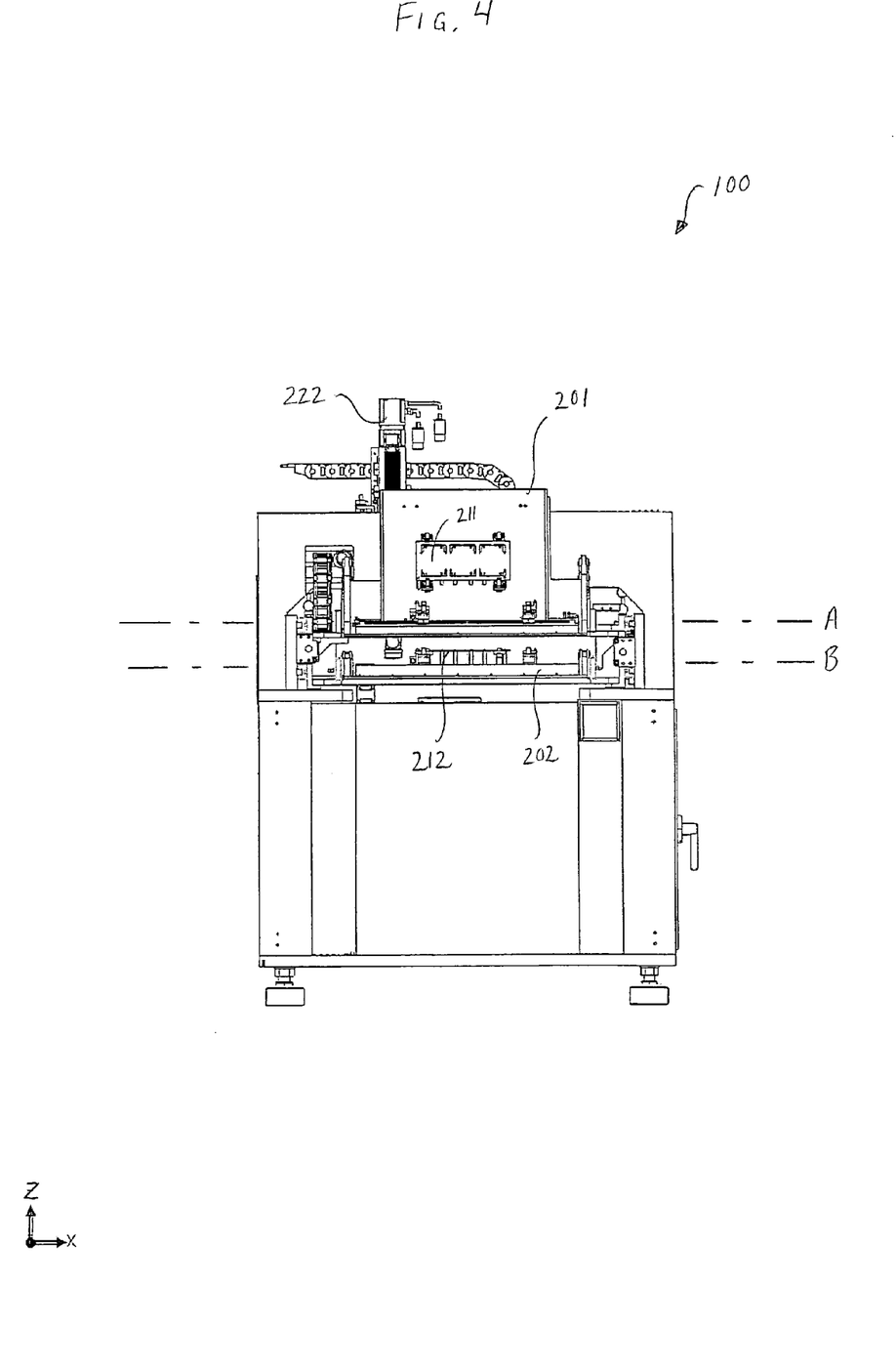
FIG. 4 is a front view of the depaneling system in an exemplary embodiment of the invention.

FIG. 4 is a front view of depaneling system 100 in an exemplary embodiment of the invention. FIG. 4 further illustrates how fixture pallet 201 tilts toward the operator. The operator would face depaneling system 100 and have a view similar to that of FIG. 4. With fixture pallet 201 tilted toward the operator, the operator can more easily and comfortably register panel 211 on fixture pallet 201. If fixture pallet 201 were left in a horizontal position as is illustrated for fixture pallet 202, then the operator would likely have to bend over and lean over the fixture pallet in order to register a panel on the fixture pallet. The position of fixture pallet 201 as illustrated in FIG. 4 is more ergonomically correct than the position of a horizontal fixture pallet.

Figure 5:
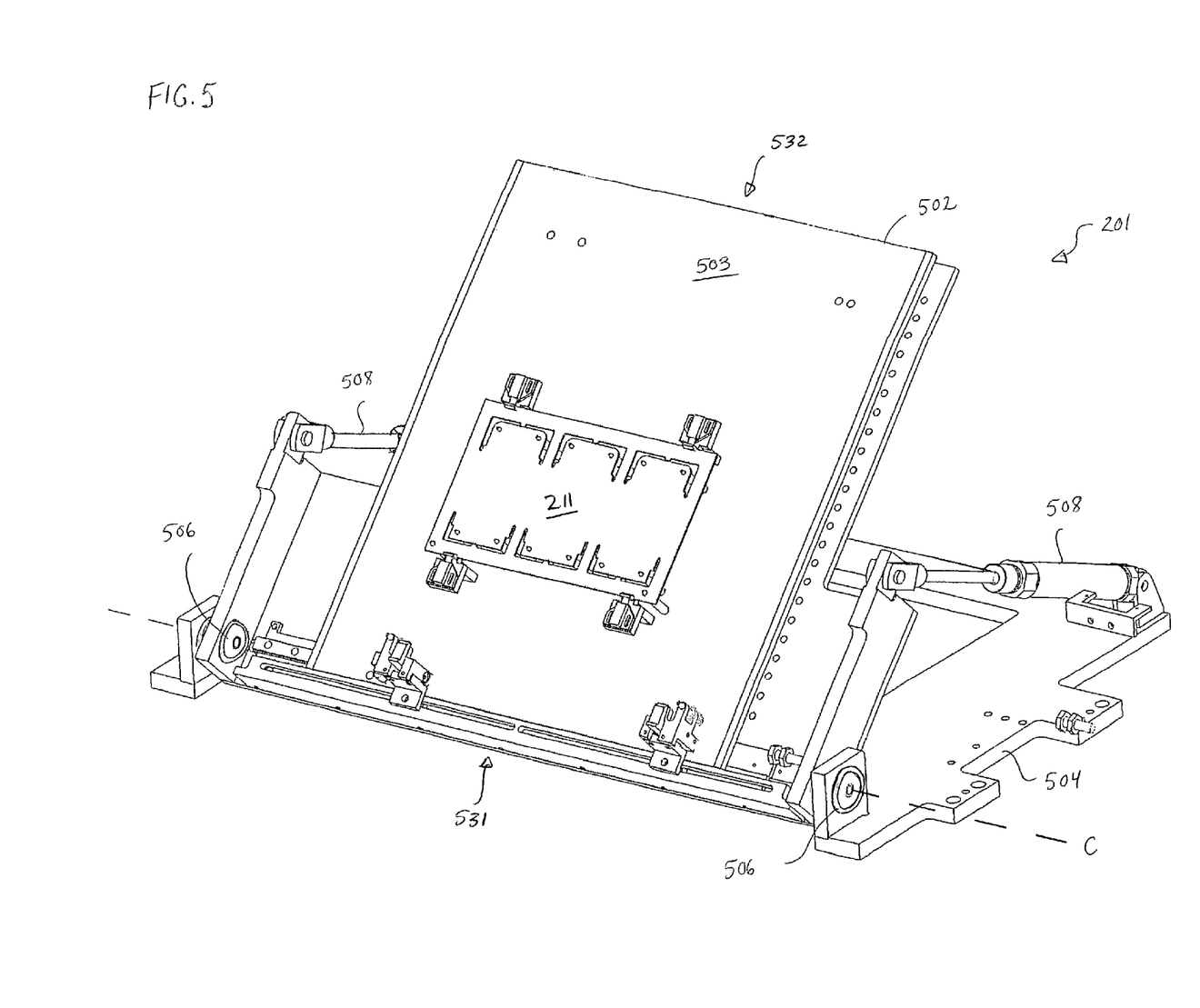
FIG. 5 is an isometric view of a fixture pallet in an exemplary embodiment of the invention.

FIG. 5 is an isometric view of fixture pallet 201 in an exemplary embodiment of the invention. The structure of fixture pallet 201 shown in FIG. 5 illustrates one embodiment, and fixture pallets of the invention may be embodied having other desired structures. Fixture pallet 201 in FIG. 5 includes a registration member 502, a base 504, and a pivot mechanism 506 that connects the registration member 502 to the base 504. A registration member 502 comprises any member having a registration surface 503 adapted to register a panel of circuit boards. The registration surface 503 may have a plurality of holes adapted to receive registration pins, clamps, etc. that hold or secure a panel for cutting. Panel 211 is illustrated as being registered on clamps and registration pins. A pivot mechanism comprises any structure, device, or component upon which something turns or rotates, such as a pin, shaft, hinge, bearing, bushing, etc. Base 504 is adapted to connect fixture pallet 201 to depaneling system 100.

Fixture pallet 201 also includes an actuator mechanism 508 connected to registration member 502 and base 504. An actuator mechanism comprises any device or component for moving or controlling something, such as an air cylinder or a fluid cylinder. If actuator mechanism 508 is extended as shown in FIG. 5, then registration member 502 is tilted toward the operator. More specifically, registration member 502 pivots on a pivot axis (the C-axis) to tilt registration surface 503 toward the operator. Registration surface 503 is in a tilted position relative to the horizontal position used for cutting. The tilted position of the registration surface 503 facilitates access to the registration surface 503 by the operator for registering a panel on registration surface 503.

Registration surface 503 has a proximal end 531 positioned closest to the operator (not shown) and a distal end 532 opposite the proximal end 531 that is away from the operator. When the registration member 502 is tilted, the distal end 532 is raised in relation to the proximal end 531 so that the registration surface 503 is tilted toward the operator. To provide the tilting motion, the distal end 532 may be raised relative to the proximal end 531 by the actuator mechanism 508, the proximal end 531 may be lowered relative to the distal end 532 by the actuator mechanism 508, or both ends 531-532 may be moved such that the distal end 532 is raised relative to the proximal end 531. Fixture pallet 201 may be tilted at any desired angle found to be ergonomically correct, such as 35 degrees from horizontal, 45 degrees from horizontal, 55 degrees from horizontal, etc. References herein to tilting of a fixture pallet refer to the tilting of the registration surface of the fixture pallet.

Figure 6:
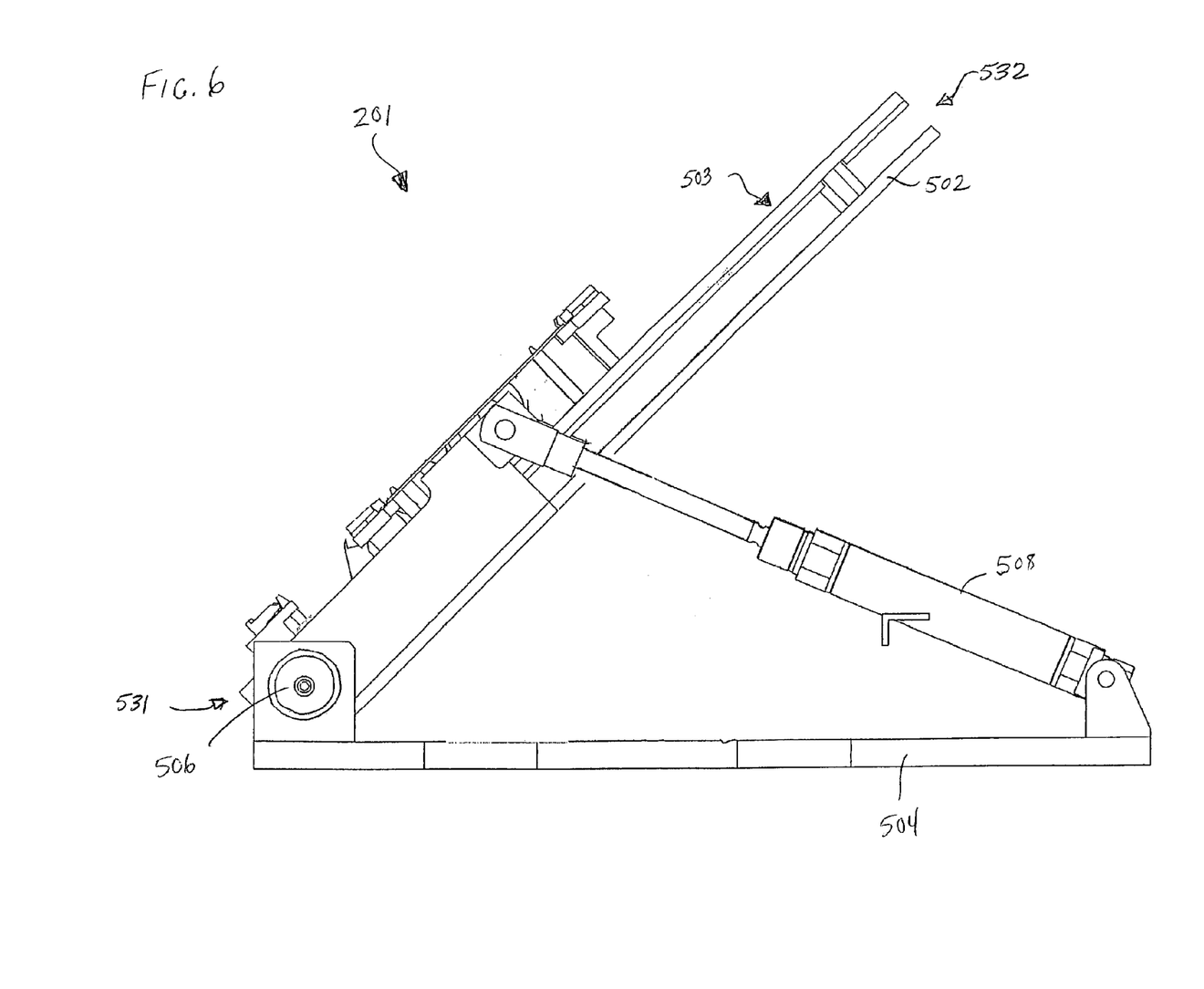
FIG. 6 is a side view of the fixture pallet with a registration member tilted toward the operator in an exemplary embodiment of the invention.

FIG. 6 is a side view of fixture pallet 201 with the registration member 502 tilted toward the operator. When the registration member 502 is tilted, registration surface 503 is at an angled position instead of in a horizontal position. This allows the operator better access to the registration surface 503 for registering panels.

Figure 7:
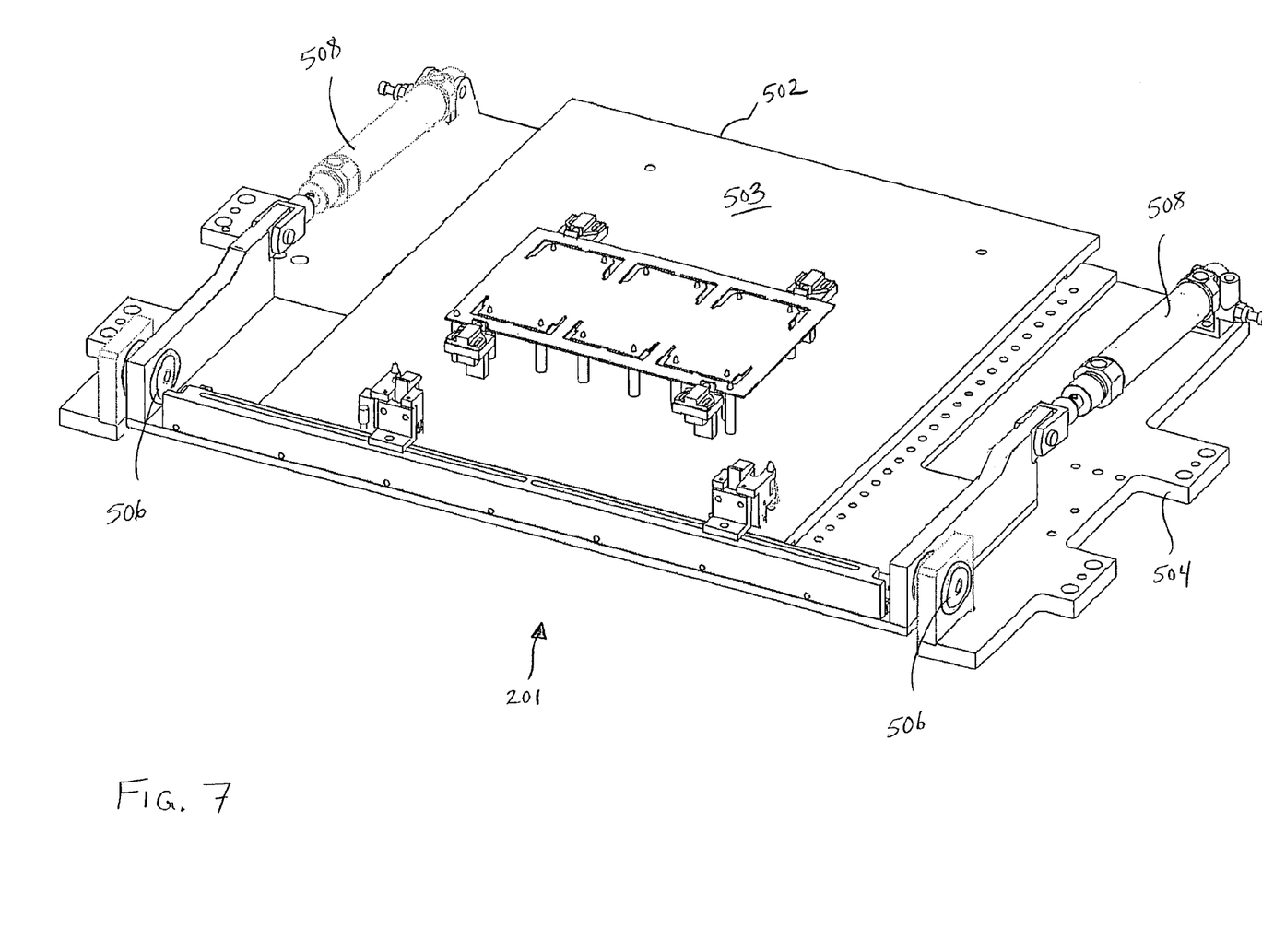
FIG. 7 is an isometric view of the fixture pallet with the registration member in a horizontal position in an exemplary embodiment of the invention.
Figure 8:
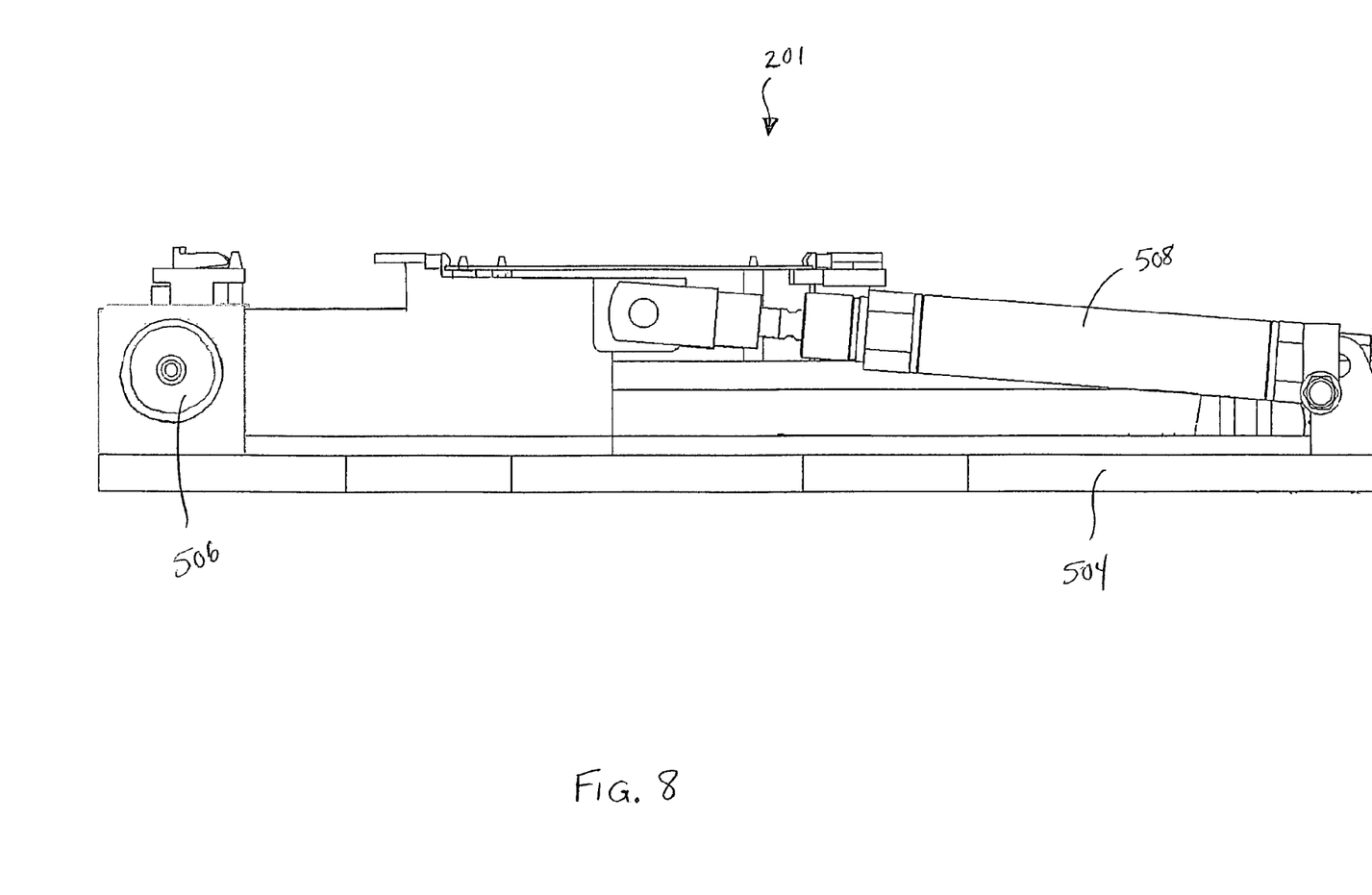
FIG. 8 is a side view of the fixture pallet with the registration member in the horizontal position in an exemplary embodiment of the invention.

FIG. 7 is an isometric view of fixture pallet 201 with registration member 502 in a horizontal position in an exemplary embodiment of the invention. If actuator mechanism 508 is compressed as shown in FIG. 7, then registration member 502 is returned to a horizontal position. Registration surface 503 is thus horizontal relative to the ground. The horizontal position is the position generally used for cutting of the panel. FIG. 8 is a side view of fixture pallet 201 with the registration member 502 in the horizontal position.

Fixture pallet 202 may have a similar structure as fixture pallet 201. For instance, fixture pallet 202 may include a registration member, a base, and a pivot mechanism as shown for fixture pallet 201. Fixture pallet 202 may also include an actuator mechanism adapted to pivot the registration member on a pivot axis to tilt a registration surface of the registration member toward the operator as shown for fixture pallet 201.

In one embodiment of the invention, fixture pallets 201-202 are stacked in an over-under configuration as shown in FIG. 4. The over-under configuration means that fixture pallet 201 is positioned in such a manner as to be above fixture pallet 202 to relative to the ground. Fixture pallet 201 may be positioned directly above fixture pallet 202 along a vertical axis (which is the Z-axis in FIG. 4). Alternatively, fixture pallet 201 may be horizontally offset slightly with respect to the vertical axis from fixture pallet 202 depending on the desired footprint of depaneling system 100.

Fixture pallet 201 has a top surface that defines a first plane A when fixture pallet 201 is in a horizontal position. Likewise, fixture pallet 202 has a top surface that defines a second plane B when fixture pallet 202 is in a horizontal position. According to the positioning of fixture pallet 201 relative to fixture pallet 202, the first plane A of the first fixture pallet is situated above the second plane B of the second fixture pallet along a vertical axis. The first plane A and the second plane B are substantially parallel in FIG. 4. The first plane A and the second plane B are separated along the vertical axis by a desired spacing.

Figure 9:
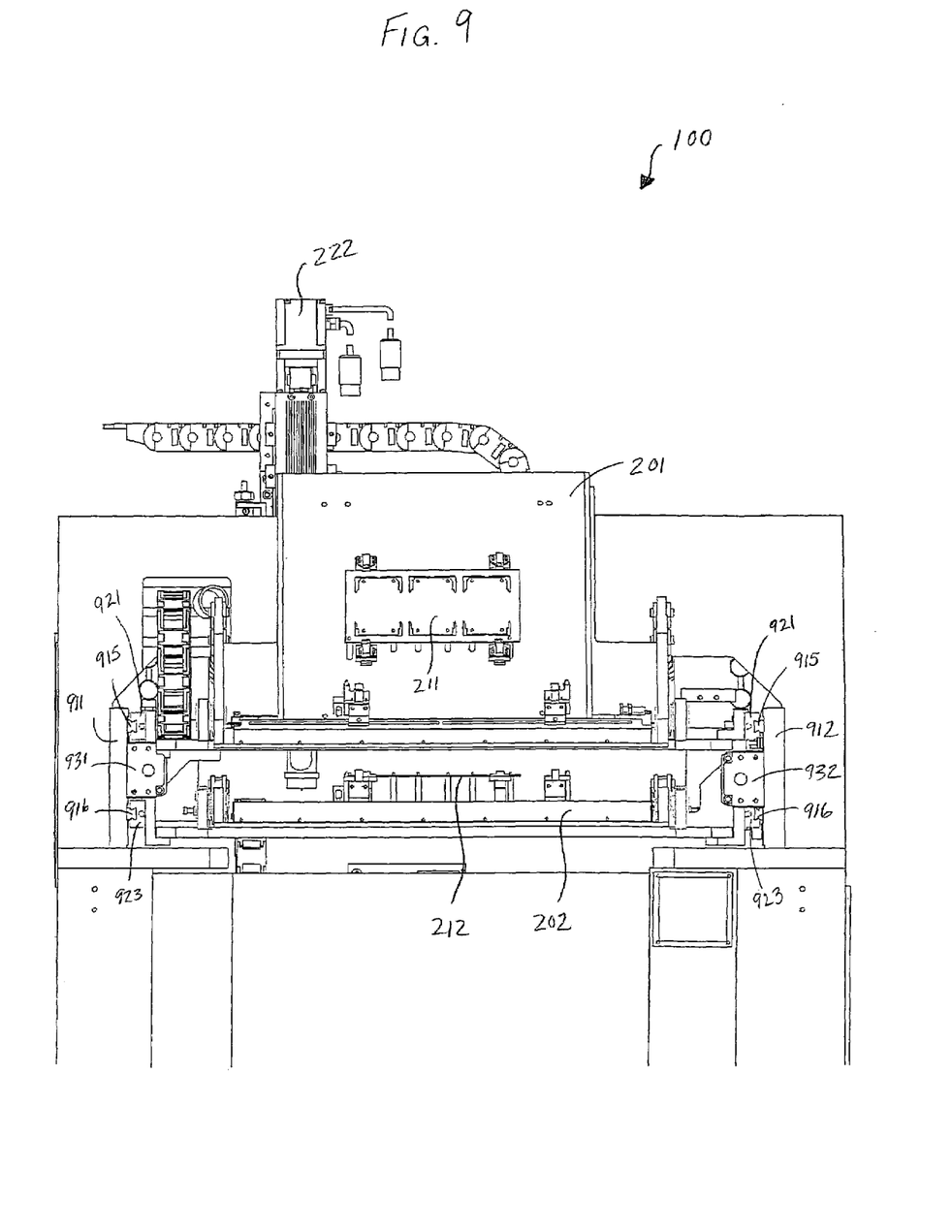
FIG. 9 is another front view of the depaneling system in an exemplary embodiment of the invention.

FIG. 9 is another front view of depaneling system 100 in an exemplary embodiment of the invention. The closer view in FIG. 9 shows the structure and assembly of depaneling system 100 in this embodiment, but the invention is not limited to this structure. Other depaneling systems may have other desired structures to provide the over-under configuration of the fixture pallets.

In this embodiment, depaneling system 100 includes a frame having two vertical members 911-912 on the left and right sides of FIG. 9. Vertical members 911-912 extend along the Y-axis (which is perpendicular to the page of FIG. 9) between the load/unload station 102 and the cutting station 220 (see FIG. 2). First rails 915 connect to vertical members 911-912 and extend along the Y-axis between the load/unload station 102 and the cutting station 220 (see FIG. 2). Second rails 916 also connect to vertical members 911-912 and extend along the Y-axis between the load/unload station 102 and the cutting station 220 (see FIG. 2). Rails comprise a structural member configured to allow another mating member to slide, roll, or otherwise move along the structural member.

The connection point of rails 915 to vertical members 911-912 is above the connection point of rails 916 to vertical members 911-912. The connection points of rails 915 and rails 916 help define the over-under configuration of the fixture pallets 201-202.

Fixture pallet 201 includes connection mechanisms 921 that are adapted to movably couple to rails 915. Connection mechanisms 921 comprise any members adapted to moveably couple to rails 915. The connection mechanisms 921 are moveable along rails 915 to allow movement by fixture pallet 201 along the Y-axis. As an example, connection mechanisms 921 may interface with rails 915 so as to slide along rails 915. Alternatively, connection mechanisms 921 may include bearings, wheels, etc, that roll along rail 915. Depaneling system 100 further includes a drive mechanism 931 adapted to move fixture pallet 201 along the Y-axis between the load/unload station 102 and the cutting station 220. An example of a drive mechanism 931 is a motor and lead screw.

Likewise, fixture pallet 202 includes connection mechanisms 923 that are adapted to movably couple to rails 916. Connection mechanisms 923 comprise any members adapted to moveably couple to rails 916. The connection mechanisms 923 are moveable along rails 916 to allow movement by fixture pallet 202 along the Y-axis. Depaneling system 100 further includes a drive mechanism 932 adapted to move fixture pallet 202 along the Y-axis between the load/unload station 102 and the cutting station 220.

Control system 106 (see FIG. 1) is configured to control drive mechanism 931 and drive mechanism 932 to position fixture pallet 201 and fixture pallet 202 in the desired locations in depaneling system 100. Fixture pallets 201-202 are moveable along the Y-axis independently of one another. As an example, fixture pallet 201 is illustrated in the load/unload station 102 of depaneling system 100 in FIG. 2. Fixture pallet 202 is illustrated in the cutting station 220 of depaneling system 100 in FIG. 2. Control system 106 alternates fixture pallets 201-202 between the load/unload station 102 and the cutting station 220 to allow for the cutting of a panel on one fixture pallet concurrently as a new panel is being loaded onto the other fixture pallet. An exemplary operation of depaneling system 100 is described as follows in reference to FIGS. 2, 3, and 9.

Assume that panel 212 has been loaded on fixture pallet 202 when fixture pallet 202 was positioned in the load/unload station 102. Control system 106 then controls drive mechanism 932 to move fixture pallet 202 from the load/unload station 102 along the Y-axis to the cutting station 220. When fixture pallet 202 is positioned in the cutting station 220, control system 106 controls cutting apparatus 220 to cut the PCBs from the panel 212 registered on fixture pallet 202. While panel 212 is being cut, control system 106 controls drive mechanism 931 to move fixture pallet 201 to the load/unload station 102 along the Y-axis. When positioned in the load/unload station 102, control system 106 controls actuator mechanism 508 to tilt the registration member 502 of fixture pallet 201 from a horizontal position to a tilted position towards an operator (see also FIG. 5). The operator then registers panel 211 on fixture pallet 201 while fixture pallet 201 is in the tilted position.

When cutting of panel 212 on fixture pallet 202 has completed, control system 106 controls drive mechanism 932 to move fixture pallet 202 out of the cutting station 220 along the Y-axis to the load/unload station 102. Control system 106 also controls actuator mechanism 508 to move the registration member 502 of fixture pallet 201 from the tilted position back to the horizontal position. Control system 106 then controls drive mechanism 931 to move fixture pallet 201 from the load/unload station 102 along the Y-axis to the cutting station 220. When fixture pallet 201 is positioned in cutting station 220, control system 106 controls cutting apparatus 222 to cut the PCBs from the panel 211 registered on fixture pallet 201.

While panel 211 is being cut and when fixture pallet 202 is positioned in the load/unload station 102, control system 106 tilts fixture pallet 202 from a horizontal position to a tilted position towards the operator. The operator unloads the liberated PCBs from fixture pallet 202 and removes the scraps left over from panel 212. The operator then registers another panel on fixture pallet 202 while fixture pallet 202 is in the tilted position, and the above process repeats.

Although specific embodiments were described herein, the scope of the invention is not limited to those specific embodiments. The scope of the invention is defined by the following claims and any equivalents thereof.

What is claimed is:

1. A depaneling system operable to cut circuit boards from panels, the depaneling system comprising:
    a cutting apparatus operable to cut circuit boards from a panel; and
    a fixture pallet operable to support a panel of circuit boards for cutting by the cutting apparatus;
    wherein the fixture pallet is further operable tilt toward an operator to allow the operator to register a panel on the fixture pallet.

2. The depaneling system of claim 1 wherein the fixture pallet is operable to pivot on a pivot axis to tilt a registration surface of the fixture pallet toward the operator to allow the operator to register the panel on the registration surface of the fixture pallet.

3. The depaneling system of claim 2 wherein the depaneling system further comprises:
    a cutting station that includes the cutting apparatus;
    a load/unload station where panels are loaded into or unloaded from the depaneling system; and
    a control system operable to control the movement of the fixture pallet between the cutting station and the load/unload station;
    wherein the control system is further operable to move the registration surface of the fixture pallet from a horizontal position to a tilted position to tilt the registration surface of the fixture pallet toward the operator when the fixture pallet is in the load/unload station.

4. The depaneling system of claim 3 wherein:
    the control system is further operable to move the registration surface of the fixture pallet from the tilted position to the horizontal position before the fixture pallet is moved out of the load/unload station.

5. The depaneling system of claim 1 wherein the fixture pallet includes:
    a registration member having a registration surface operable to register a panel for cutting;
    a base; and
    a pivot mechanism connecting the registration member to the base that defines a pivot axis.

6. The depaneling system of claim 5 wherein the fixture pallet further includes:
    an actuator mechanism connected to at least the registration member that is operable to move the registration member so as to tilt the registration surface of the registration member about the pivot axis towards the operator.

7. The depaneling system of claim 1 further comprising:
    another fixture pallet operable to support a panel of circuit boards for cutting by the cutting apparatus;
    wherein the fixture pallets are positioned in the depaneling system in an over-under configuration along a vertical axis.

8. The depaneling system of claim 7 wherein:
    the other fixture pallet is operable to tilt toward an operator to allow the operator to register a panel on the other fixture pallet.

9. A depaneling system operable to cut circuit boards from panels, the depaneling system comprising:
    a cutting station having a cutting apparatus operable to cut circuit boards from a panel;
    a load/unload station where panels are loaded into or unloaded from the depaneling system; and
    a fixture pallet operable to support a panel of circuit boards for cutting and operable to move between the cutting station and the load/unload station;
    wherein the fixture pallet is further operable to pivot on a pivot axis to tilt toward an operator to allow the operator to register a panel on the fixture pallet.

10. The depaneling system of claim 9 wherein the fixture pallet is operable to tilt toward the operator when the fixture pallet is in the load/unload station.

11. The depaneling system of claim 10 wherein the fixture pallet is operable to return to a horizontal position before being moved out of the load/unload station.

12. The depaneling system of claim 9 further comprising:
    another fixture pallet operable to support a panel of circuit boards for cutting by the cutting apparatus;
    wherein the fixture pallets are positioned in the depaneling system in an over-under configuration along a vertical axis;

wherein the other fixture pallet is operable to tilt toward an operator to allow the operator to register a panel on the other fixture pallet.

13. A depaneling system operable to cut circuit boards from panels, the depaneling system comprising:
- a cutting station having a cutting apparatus operable to cut circuit boards from a panel;
- a load/unload station where panels are loaded into or unloaded from the depaneling system;
- a first fixture pallet operable to support a first panel of circuit boards for cutting and operable to move between the cutting station and the load/unload station; and
- a second fixture pallet operable to support a second panel of circuit boards for cutting and operable to move between the cutting station and the load/unload station;
- wherein the first fixture pallet is further operable to pivot on a first pivot axis to tilt toward an operator when the first fixture pallet is in the load/unload station to allow the operator to register a panel on the first fixture pallet.

14. The depaneling system of claim 13 wherein the second fixture pallet is further operable to pivot on a second pivot axis to tilt toward the operator when the second fixture pallet is in the load/unload station to allow the operator to register a panel on the second fixture pallet.

15. The depaneling system of claim 14 further comprising:
- a first drive mechanism operable to move the first fixture pallet between the load/unload station and the cutting station;
- a second drive mechanism operable to move the second fixture pallet between the load/unload station and the cutting station;
- a first actuator mechanism operable to pivot the first fixture pallet on the first pivot axis to tilt the first fixture pallet toward the operator; and
- a second actuator mechanism operable to pivot the second fixture pallet on the second pivot axis to tilt the second fixture pallet toward the operator.

16. The depaneling system of claim 15 wherein:
the control system is further operable to control the first drive mechanism to move the first fixture pallet to the load/unload station, and to control the first actuator mechanism to tilt the first fixture pallet toward the operator to allow the operator to load the first panel on the first fixture pallet.

17. The depaneling system of claim 16 wherein:
the control system is further operable to control the second drive mechanism to move the second fixture pallet from the cutting station to the load/unload station after completion of the cutting of the second panel, and to control the second actuator mechanism to tilt the second fixture pallet toward the operator to allow the operator to load another panel on the second fixture pallet.

18. The depaneling system of claim 17 wherein:
the control system is further operable to control the first actuator mechanism to return the first fixture pallet from a tilted position to a horizontal position, and to control the first drive mechanism to move the first fixture pallet from the load/unload station to the cutting station.

19. The depaneling system of claim 13:
wherein the first fixture pallet is positioned above the second fixture pallet in the depaneling system along a vertical axis.

* * * * *